(12) United States Patent
Patel et al.

(10) Patent No.: US 6,747,872 B1
(45) Date of Patent: Jun. 8, 2004

(54) PRESSURE CONTROL OF COOLING FLUID WITHIN A PLENUM

(75) Inventors: Chandrakant D. Patel, Fremont, CA (US); Cullen E. Bash, San Francisco, CA (US); Scot Austin, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/375,003

(22) Filed: Feb. 28, 2003

(51) Int. Cl.[7] ................................................. H05K 7/20
(52) U.S. Cl. ................... 361/695; 62/259.2; 62/263; 165/80.3; 165/104.33; 454/184
(58) Field of Search ............... 62/259.2, 263; 165/80.3, 104.33, 121, 122, 126; 236/49.1–49.5; 361/678, 688–696, 700–702; 454/184

(56) References Cited

U.S. PATENT DOCUMENTS

| | | | | |
|---|---|---|---|---|
| 5,467,609 A | * | 11/1995 | Feeney | 62/259.2 |
| 5,718,628 A | * | 2/1998 | Nakazato et al. | 454/184 |
| 5,956,228 A | * | 9/1999 | Zahorsky et al. | 361/695 |
| 6,142,866 A | * | 11/2000 | Wright | 454/184 |
| 6,374,627 B1 | * | 4/2002 | Schumacher et al. | 62/259.2 |
| 6,398,505 B1 | * | 6/2002 | Sekiguchi | 417/2 |
| 6,574,104 B2 | * | 6/2003 | Patel et al. | 361/695 |
| 2003/0053293 A1 | * | 3/2003 | Beitelmal et al. | 361/687 |

FOREIGN PATENT DOCUMENTS

JP    4022547797    * 10/1990 ............... 361/694

\* cited by examiner

Primary Examiner—Harold Joyce

(57) ABSTRACT

Cooling fluid pressure within a plenum of a cooling system is controlled by activating the cooling system, sensing a plurality of cooling fluid pressures at a plurality of respective locations within the plenum, determining whether pressure differences between the plurality of sensed cooling fluid pressures are within a predetermined pressure differential, and modulating a variable volume device in response to the pressure differences being outside the predetermined pressure differential. The cooling system is configured to cool racks in a data center and includes a cooling device in fluid communication with the plenum. The plenum is in fluid communication with a vent configured to supply cooling fluid to the racks. The variable volume device is configured to control a flow resistance of cooling fluid within the plenum and is positioned between the plenum and the vent.

37 Claims, 8 Drawing Sheets

PRESSURE CONTROL OF COOLING FLUID WITHIN A PLENUM

BACKGROUND

A data center may be defined as a location, e.g., room, that houses numerous printed circuit (PC) board electronic systems arranged in a number of racks. A standard rack may be defined as an Electronics Industry Association (EIA) enclosure, 78 in. (2 meters) wide, 24 in. (0.61 meter) wide and 30 in. (0.76 meter) deep. Standard racks may be configured to house a number of PC boards, e.g., about forty (40) boards, with future configurations of racks being designed to accommodate up to eighty (80) boards. The PC boards typically include a number of components, e.g., processors, micro-controllers, high speed video cards, memories, semiconductor devices, and the like, that dissipate relatively significant amounts of heat during the operation of the respective components. For example, a typical PC board comprising multiple microprocessors may dissipate approximately 250 W of power. Thus, a rack containing forty (40) PC boards of this type may dissipate approximately 10 KW of power.

The power required to remove the heat dissipated by the components in the racks is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of racks.

Conventional data centers are typically cooled by operation of one or more air conditioning units. The compressors of the air conditioning units typically require a minimum of about thirty (30) percent of the required cooling capacity to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially static operation of conventional vents within data centers are generally designed to operate efficiently within a relatively narrow range heat loads. However, if electronic components are allowed to exceed rated temperatures, data corruption or damage may result. Thus, conventional cooling systems and vent configuration typically operated in a worst case scenario. For at least these reasons, cooling fluid is supplied to the components at around 100 percent of the estimated cooling requirement. In this respect, conventional cooling systems often attempt to cool components that may not be operating at a level which may cause its temperature to exceed a predetermined temperature range. Consequently, conventional data centers often incur greater startup costs for cooling systems large enough to meet these cooling requirements as well as greater amounts of operating expenses than may be necessary to sufficiently cool the heat generating components contained in the racks of data centers.

SUMMARY

According to an embodiment, the invention pertains to a method of controlling cooling fluid pressure within a plenum of a cooling system for cooling racks in a data center. In this method, the cooling system is activated and a plurality of cooling fluid pressures are sensed at a plurality of respective locations within the plenum. In addition, it is determined whether pressure differences between the plurality of sensed cooling fluid pressures are within a predetermined pressure differential and a variable volume device configured to control a flow resistance of cooling fluid within the plenum is modulated in response to the pressure differences being outside the predetermined pressure differential. The cooling system includes a cooling device in fluid communication with the plenum and the plenum is in fluid communication with a vent configured to supply cooling fluid to the racks. Furthermore, the variable volume device is positioned between the plenum and the vent.

BRIEF DESCRIPTION OF THE DRAWINGS

Embodiments of the invention are illustrated by way of example and not limitation in the accompanying figures in which like numeral references refer to like elements, and wherein.

DETAILED DESCRIPTION

For simplicity and illustrative purposes, the principles of the invention are described by referring mainly to an embodiment thereof. In the following description, numerous specific details are set forth in order to provide a thorough understanding of the invention. It will be apparent however, to one of ordinary skill in the art, that the invention may be practiced without limitation to these specific details. In other instances, well known methods and structure have not been described in detail so as not to unnecessarily obscure the invention.

According to an embodiment of the invention, controllable vents in fluid communication with a cooling system are configured to adjust cooling fluid, e.g., air, flow to various racks located throughout a data center, e.g., location that houses numerous printed circuit (PC) board electronic systems arranged in a number of racks, based upon the detected and/or anticipated temperatures at various locations throughout the data center. In one respect, by substantially increasing the cooling fluid flow to those racks dissipating greater amounts of heat and by substantially decreasing the cooling fluid flow to those racks dissipating lesser amounts of heat, the amount of energy required to operate the cooling system may be relatively reduced. Thus, instead of requiring the operation of relatively high output devices, e.g., compressors, fans, etc., of the cooling system at substantially 100 percent of the anticipated heat dissipation from the racks, those devices may be operated according to the actual cooling needs.

In addition, as the cooling needs within the data center fluctuate due to changes in heat dissipation by the racks, the pressure of cooling fluid at various locations within a plenum may fluctuate relative to one another. The plenum serves to connect the individual vents to the cooling device. If the pressure of the cooling fluid within the plenum fluctuates in an uncontrolled manner, cooling fluid may be supplied to the various racks in an unpredictable and/or inefficient manner. In this regard, according to another embodiment of the invention, by controlling the cooling fluid pressure within the plenum, improved control of the flow of cooling fluid to the various racks may be attained.

Furthermore, the racks may be positioned throughout the data center according to their anticipated heat loads to thereby enable computer room air conditioning (CRAC) units located at various positions throughout the data center to operate in a more efficient manner. In another respect, the positioning of the racks may be determined through implementation of modeling and metrology of the cooling fluid flow throughout the data center. Moreover, the numerical modeling may be implemented to determine the volume flow rate and velocity of the cooling fluid flow through each of the vents.

Figure 1:
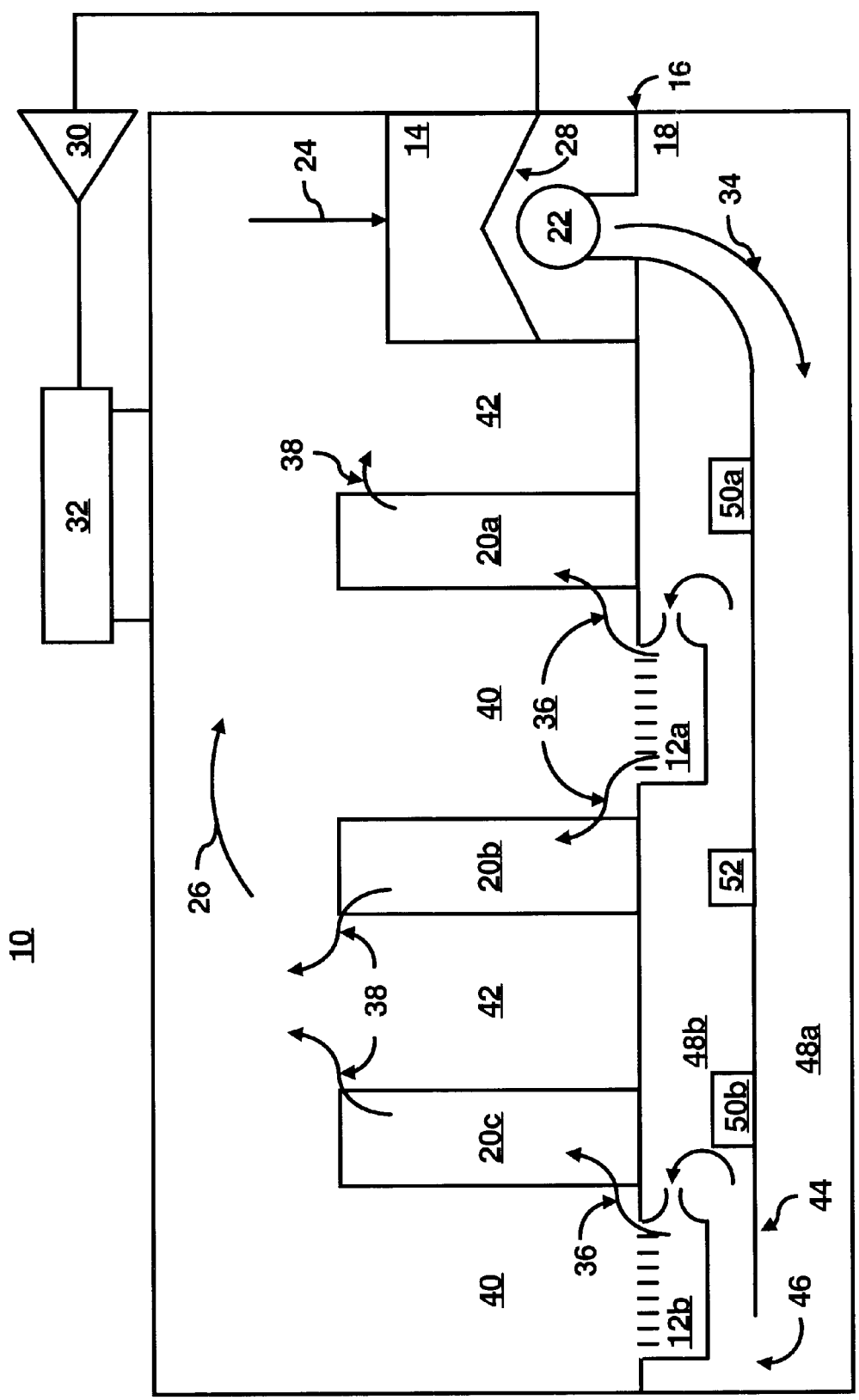
FIG. 1 shows a simplified schematic illustration of a data center containing a cooling system in accordance with an embodiment of the invention.

FIG. 1 shows a simplified schematic illustration of a data center 10 containing a plurality of vents 12a and 12b in fluid communication with a cooling system 14. The data center 10, according to this embodiment of the invention, includes a raised floor 16. A plurality of wires and communication lines (not shown) may be located in a plenum 18 beneath the raised floor 16. In addition, the plenum 18 may function to deliver cooling fluid from the cooling system 14 to a plurality of racks 20a–20c. As will be described in further detail below, the plenum 18 may comprise a pressurized enclosure. Although the data center 10 is illustrated in FIG. 1 as containing three racks 20a–20c, two vents 12a and 12b, and a cooling system 14, it is to be understood that the data center may include any number of racks, e.g., 100 racks, vents, e.g., one or more, and cooling systems, e.g., one or more. Therefore, this depiction is for illustrative and simplicity of description purposes only and is not intended to limit the invention in any respect.

The racks 20a–20c generally house a plurality of components (not shown), e.g., processors, micro-controllers, high speed video cards, memories, semi-conductor devices, and the like. The components may be elements of subsystems (not shown), e.g., computers, servers, etc. The subsystems and the components may be implemented to perform various electronic, e.g., computing, switching, routing, displaying, and the like, functions. In the performance of these electronic functions, the components, and therefore the subsystems, generally dissipate relatively large amounts of heat. Because racks 20a–20c have been generally known to include upwards of forty (40) or more subsystems, they may require substantially large amounts of cooling fluid to maintain the subsystems and the components generally within a predetermined operating temperature range. According to an embodiment of the invention, by substantially individually and precisely controlling the amount of cooling fluid delivered to the components and the subsystems located in the racks 20a–20c based upon their respective heat loads, a relatively inexpensive or existing, essentially constant output cooling system 14 may be utilized in a more efficient manner than conventional cooling systems. According to another aspect of an embodiment of the invention, by substantially controlling the amount of cooling fluid delivered to the components and the subsystems located in the racks 20a–20c based upon their respective heat loads, the power consumed by a variable output cooling system 14 to supply the cooling fluid may also be controlled in a more efficient manner as compared to a conventional cooling system.

The cooling system 14 generally includes a fan 22 for supplying cooling fluid into the plenum 18 (e.g., pressurized enclosure). Air may be supplied to the fan 22 from the returned cooling fluid in the data center 10 as indicated by arrows 24 and 26. In operation, the returned cooling fluid enters into the cooling system 14 as indicated by arrow 24 and is cooled by operation of various well know components of a cooling system (e.g., cooling coil, compressor, condenser, chilled water heat exchange, etc.) and/or in any reasonably suitable manner generally known to those of ordinary skill in the art. In a specific example, the cooling system 14 may include a cooling coil 28, a compressor 30, and a condenser 32.

In one embodiment, the cooling system 14 may be a substantially constant output cooling system. That is, the fan 22 and/or the compressor 30 may operate at essentially one speed. In this embodiment, one or both of the fan 22 and the compressor 30 may be cycled on and off to control the output of the cooling system 14 based upon the overall cooling fluid needed by the heat loads in the racks 20a–20c. In another embodiment, the output of cooling system 14 may be varied based upon the cooling fluid needed by the heat loads in the racks 20a–20c. For example, the capacity of the compressor 30 and the speed of the fan 22 may both be modified to thereby control the temperature and the amount of cooling fluid flow delivered to the racks 20a–20c. While it is within the scope of the invention that a variable cooling system be utilized, for the sake of simplicity, only essentially constant output cooling systems will be discussed herein. However, a more detailed description of variable cooling systems may be found in co-pending U.S. application Ser. No. 09/970,707, filed Oct. 5, 2001, which is assigned to the assignee of the present invention and is incorporated by reference herein in its entirety. Because the specific type of compressor 30 and fan 22 to be employed with the embodiments of the invention may vary according to individual needs, the invention is not limited to any specific type of compressor or fan. Instead, any reasonably suitable type of compressor 30 and fan 22 that are capable of accomplishing certain aspects of the invention may be employed with the embodiments of the invention. The choice of compressor 30 and fan 22 may depend upon a plurality of factors, e.g., cooling requirements, costs, operating expenses, etc.

Figure 5:
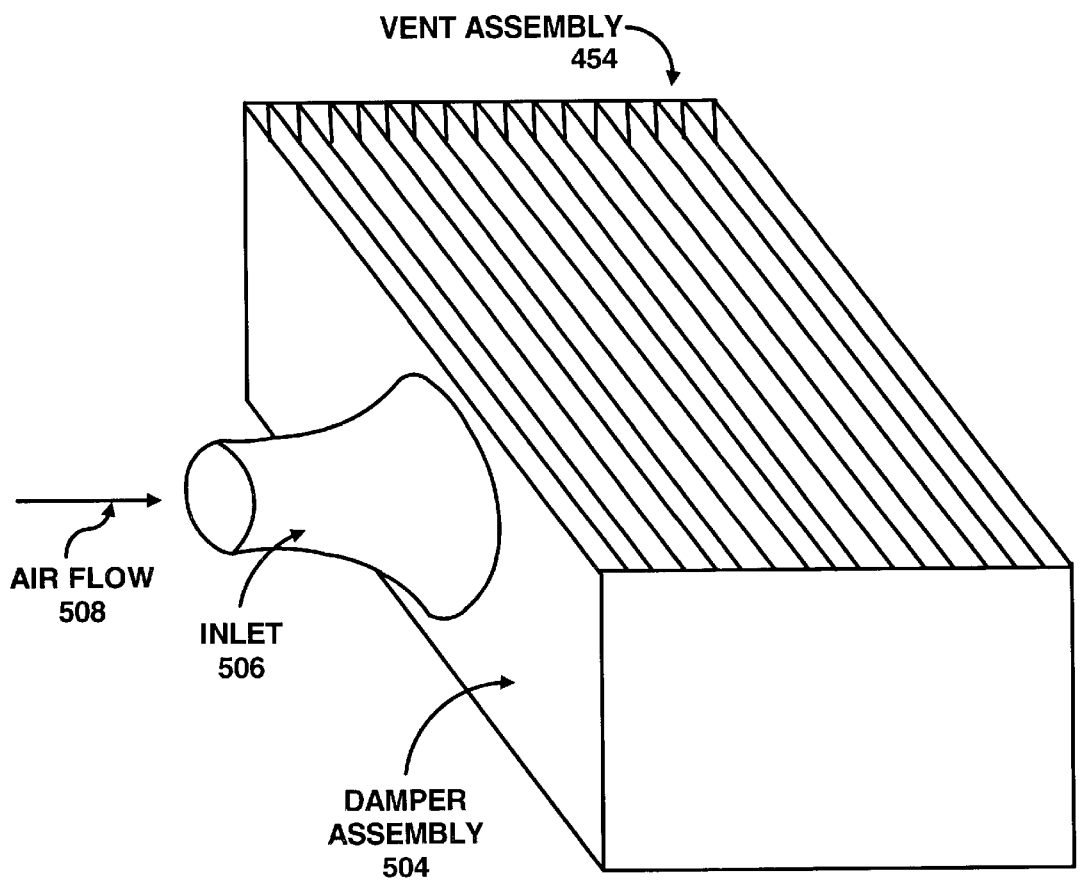
FIG. 5 shows a simplified schematic illustration of a vent in accordance with an embodiment of the invention.
Figure 6:
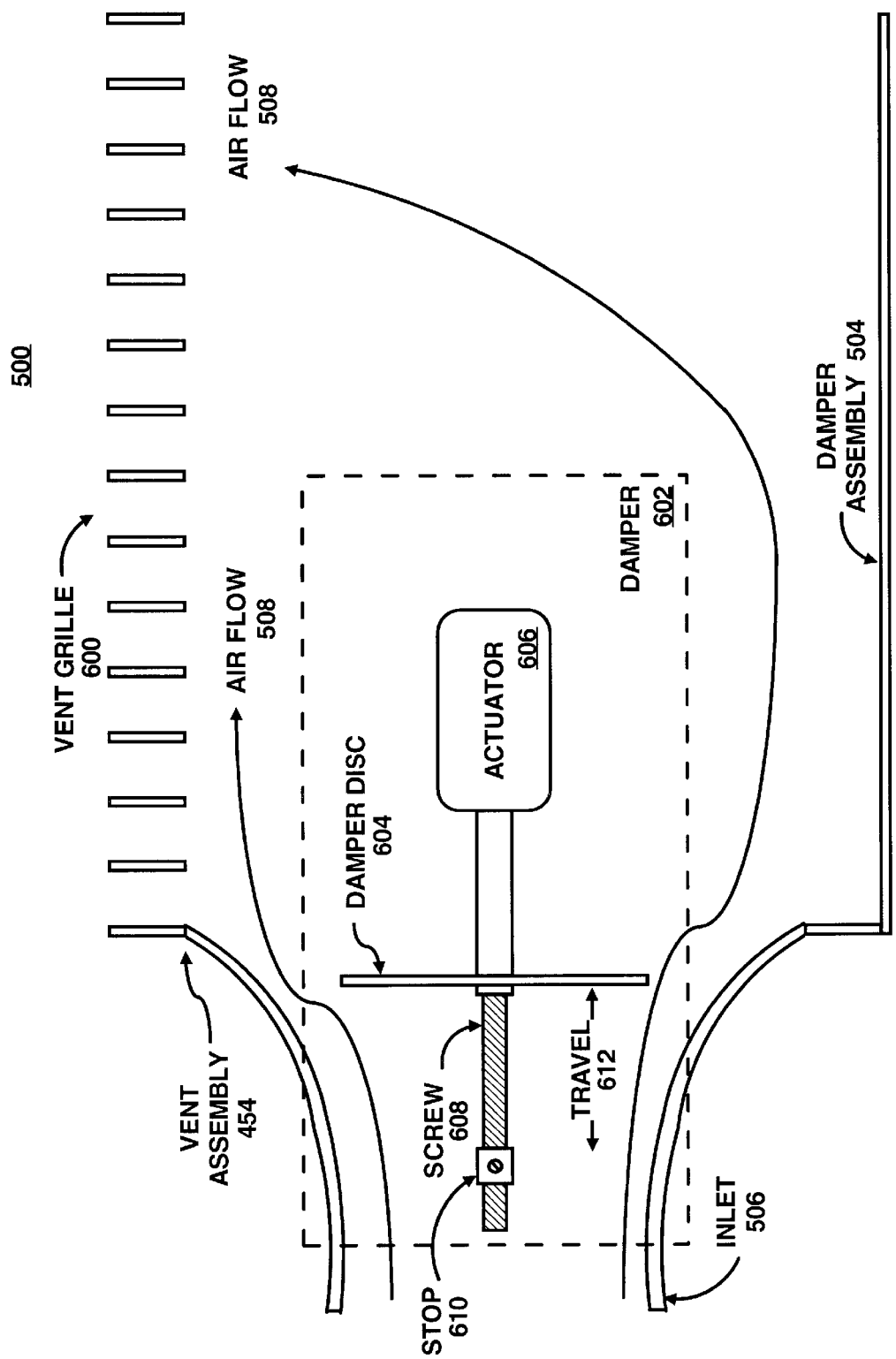
FIG. 6 shows a simplified cross sectional illustration of a vent in accordance with an embodiment of the invention.

The cooling fluid generally flows from the fan 22 and into the plenum 18 as indicated by the arrow 34. The cooling fluid flows out of the raised floor 16 through the vents 12a and 12b that generally operate to modify the resistance to the flow of cooling fluid (flow resistance) within the plenum 18 to thereby alter the velocity and the volume flow rate of the cooling fluid therethrough. In this regard, and as illustrated in FIGS. 5 and 6, the vents 12a and 12b are dynamically controllable. Specifically, a variable volume device ("VVD") may be configured to control the flow resistance within the plenum and thus modulate the flow of cooling fluid delivered to one or more of the vents 12a and 12b (see FIGS. 4A, 4B, 5, and 6). Therefore, according to this embodiment of the invention, the racks 20a–20c may receive substantially individualized and localized amounts of cooling fluid according to their heat loads. In addition, according to this and other embodiments of the invention, characteristics such as, flow resistance, flow velocity and pressure, of the cooling fluid within the plenum 18 may be controlled by the operation of the vents 12a and 12b.

The arrows 36 indicate the general direction of travel of the cooling fluid and the arrows 38 indicate the general direction of travel of fluid heated by the heat dissipating components located within the racks 20a–20c. As may be seen in FIG. 1, areas within the data center 10 may comprise either cool aisles 40 or hot aisles 42, or a combination thereof. The cool aisles 40 are those aisles that include the vents 12a and 12b and thus receive cooling fluid for delivery to the racks 20a–20c. The hot aisles 42 are those aisles that receive air heated by the heat dissipating components in the racks 20a–20c.

In addition, various sections of each of the racks 20a–20c may also receive substantially individualized amounts of cooling fluid. By way of example, if the bottom halves of the racks 20a and 20b are operating at maximum power, thereby dissipating a maximum level of heat load, and the upper halves are operating at little or no power, the vent 12a may be configured to enable cooling fluid flow therethrough to have a relatively high volume flow rate with a relatively low velocity. In this manner, the cooling fluid may operate to generally supply greater cooling to the lower halves of the racks 20a and 20b, whereas the upper halves receive relatively lesser amounts of cooling fluid. In addition, if the upper half of the rack 20c is operating at approximately 50 percent of the maximum power, and the lower half is operating at little or no power, the vent 12b may be configured to enable cooling fluid flow therethrough to have a relatively low volume flow rate with a relatively high velocity. In this manner, the cooling fluid flow may have sufficient momentum to adequately reach and cool the upper half of the rack 20c. To provide sufficient cooling fluid velocity, it may be beneficial for the cooling fluid within the plenum 18 to have a relatively higher static pressure than outside of the plenum 18. In this regard, the static pressure within the plenum 18 generally corresponds to a combination of the flow volume of cooling fluid entering the plenum 18 and the flow resistance within the plenum 18. In a data center having a substantially constant output cooling system (e.g., the cooling system 14), the static pressure within the plenum 18 may therefore be controlled by controlling the flow resistance within the plenum 18. This flow resistance may be controlled by modulating the flow of cooling fluid through the vents 12a and/or 12b. Thus, in one respect, by controlling the flow of cooling fluid through the vents 12a and 12b, sufficient static pressure may be maintained within the plenum 18 to provide adequate cooling fluid velocity.

According to an embodiment of the invention, the cooling fluid supply for flow through each of the vents 12a and 12b may be maintained at a relatively uniform pressure. In this respect, the plenum 18 may include a divider 44. The length of the divider 44 may extend substantially along the entire length of plenum 18, i.e., in the direction generally perpendicular to the plane of FIG. 1. The width of the divider 44 may be extend from the cooling system 14 to substantially the end of the plenum 18 to thus create a gap 46 between a side edge of the divider 44 and a side surface of the plenum 18. The divider 44 generally divides the plenum 18 into two relatively separate chambers 48a, 48b. The first chamber 48a is in fluid communication with the outlet of the fan 22. The second chamber 48b is in fluid communication with the first chamber 48a substantially through the gap 46. In this respect, the cooling fluid flow originating from the fan 22 must travel substantially the entire width of the plenum 18, i.e., through the first chamber 48a, for the fluid flow to enter into the second chamber 48b.

The cooling fluid in the second chamber 48b may be maintained at a substantially uniform static pressure by virtue of the manner in which the cooling fluid is introduced into the second chamber 48b. The rate at which the cooling fluid is supplied into the first chamber 48a by the fan 22 may cause a relatively large amount of turbulence in the cooling fluid located in the first chamber 48a. The turbulence is generally greatest at the outlet of the fan 22 and generally decreases as the distance from the outlet increases. By virtue of the distance the cooling fluid must travel to enter into the second chamber 48b, the cooling fluid may have substantially stabilized, thus enabling the cooling fluid entering into the second chamber 48b to be relatively calm. In this respect, the divider 44 operates to provide a relatively consistent cooling fluid pressure supply for the vents 12a and 12b. This relatively consistent cooling fluid pressure may increase the predictability with which cooling fluid exits the vents 12a and 12b thus, increasing the efficiency of cooling components within the racks 20a–20c.

The pressure of the cooling fluid at various locations in the second chamber 48b may be measured by pressure sensors 50a and 50b. In this respect, the pressure sensors 50a and 50b may detect any discernable changes in the pressure of the cooling fluid at or near their respective locations within the second chamber 48b and relay that information to a vent controller (see FIG. 2). The vent controller may operate to control the vents 12a and 12b to modulate the flow of cooling fluid flowing therethrough and, in this manner, control the resistance of flow within the plenum 18. Thus, the vent controller may be configured to control the static pressure within the second chamber 48b. For example, by generally increasing the flow resistance (e.g., reducing the outflow) of cooling fluid within the second chamber 48b while substantially maintaining the flow into the second chamber 48b, static pressure within the second chamber 48b may be increased. In addition, by individually controlling the vents 12a and 12b, flow resistance and hence, the static pressure at various locations within the plenum 18, may be controlled. Therefore, operation of the vents 12a and 12b may be related to cooling fluid pressures within the plenum 18, to the cooling requirements of the racks 20a–20c, and the amount of energy required to supply the racks 20a–20c with cooling fluid in a substantially optimized manner. In one respect, by increasing the efficiency with which the components contained in the racks 20a–20c are cooled, a substantial energy savings over known cooling systems may be realized.

In various embodiments of the invention, the capacity of the compressor 30 may be substantially constant or vary according to changes in the temperature of the cooling fluid located in the second chamber 48b. As such, a plenum temperature sensor 52 may be located within the second chamber 48b to relay temperature measurements to the cooling system 14. The plenum temperature sensor 52 may comprise any reasonably suitable temperature sensor known to those skilled in the art. Therefore, the compressor 30 may be operated to generally maintain the temperature of the cooling fluid within the second chamber 48b at a substantially constant level. For example, operation of the compressor 30 may be cycled on and off to control the temperature of cooling fluid output from the cooling system 14 in response to detected and/or anticipated changes in heat loads generated in the racks 20a–20c. In another embodiment, the capacity of the compressor 30 may vary according to detected and/or anticipated changes in heat loads generated in the racks 20a–20c. As an example, the compressor 30 capacity may be increased as the heat loads generated in the racks 20a–20c increase. In this regard, the power required to operate the compressor 30 may be substantially optimized, thereby reducing the total power required to operate the cooling system 14.

Figure 2:
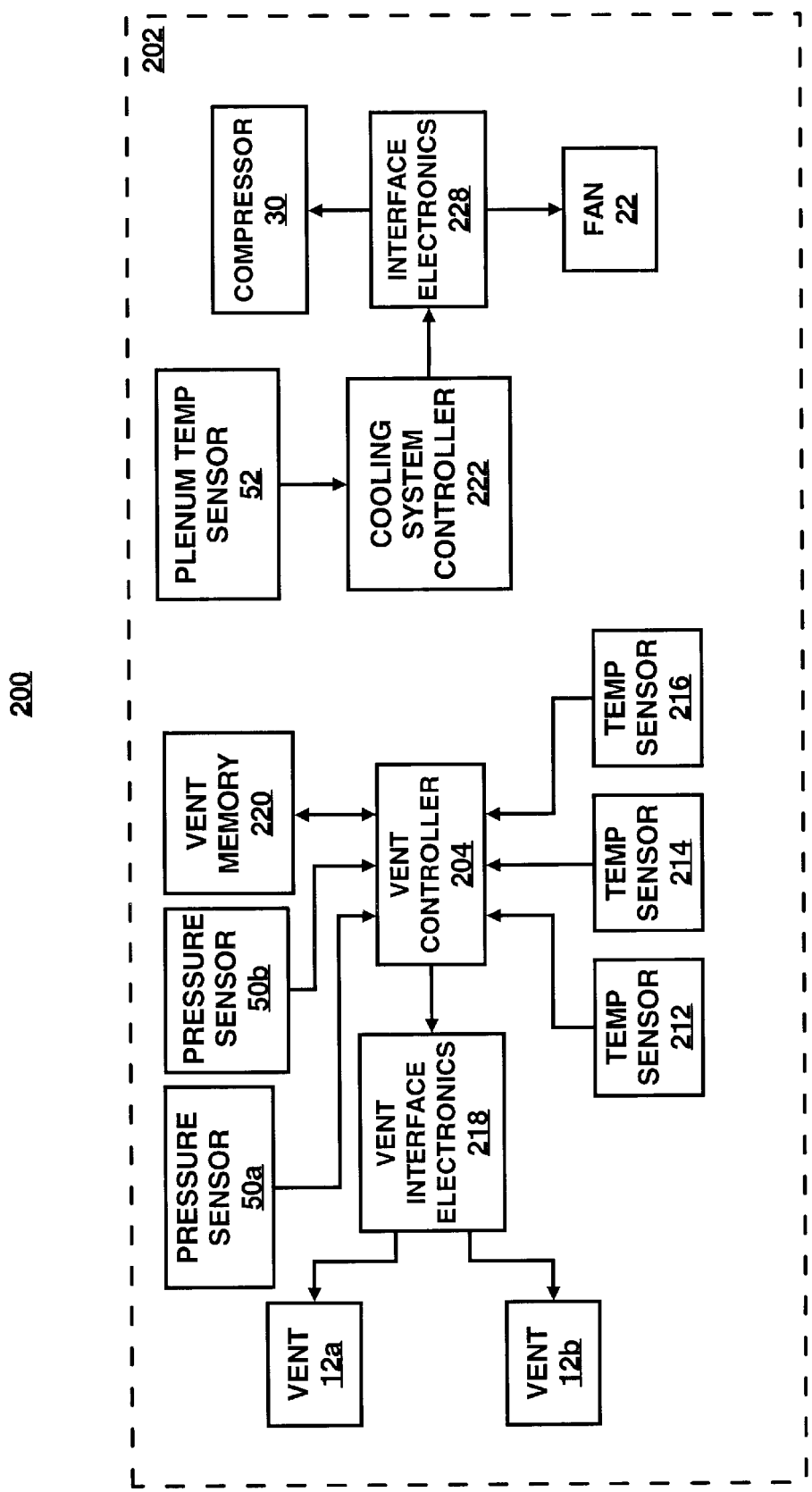
FIG. 2 illustrates a block diagram of a control scheme for a cooling system according to an embodiment of the invention.

Referring to FIG. 2, there is illustrated a block diagram 200 of a control scheme for a cooling system 202 according to an embodiment of the invention. The following description of the block diagram 200 is a relatively simplified manner in which the cooling system 202 may be operated. In this respect, it is to be understood that the following description of the block diagram 200 is but one manner of a variety of different manners in which such a cooling system 202 may be operated.

A vent controller 204 is generally configured to control the operation of the vents 12a and 12b. In this regard, the vent controller 204 may comprise a microprocessor, a micro-controller, an application specific integrated circuit (ASIC), and the like. The manner in which the vent controller 204 operates the vents 12a and 12b, i.e., the flow of cooling fluid therethrough, may be predicated upon the detected or anticipated temperatures of the racks 20a–20c, portions thereof, and/or detected or anticipated pressures.

For example, with regard to detected temperatures, a plurality of temperature sensors 212–216, e.g., thermocouples, may be positioned at various positions around the subsystems and/or the racks 20a–20c. Each of the temperature sensors 212–216 may correspond to a respective one of the vents 12a and 12b. By way of example, one temperature sensor 212 may affect the flow of cooling fluid flow through one vent 12a.

Alternatively, with regard to anticipated temperatures, anticipated cooling requirements for each of the racks 20a–20c and/or various sections of the racks may be predicated upon an impending load on the racks 20a–20c and/or sections of the racks. For example, the vent controller 204 may be connected to another controller, e.g., a central controller for the subsystems (not shown), which anticipates the heat load the components and/or the subsystems will dissipate. This information may be relayed to the vent controller 204 which may then manipulate the vents 12a and 12b according to the anticipated load.

With regard to detected pressures, the pressure sensors 50a and 50b may relay pressure measurements and/or detected changes in the pressure within the plenum 18 to the vent controller 204. In general, the pressure is defined as the pressure difference between a location within the plenum 18 (generally below a vent 12a or 12b) and a location essentially above the respective vent 12a or 12b. The vent controller 204 may utilize this information to manipulate the vents 12a and 12b as described herein. Furthermore, in a manner similar to anticipating temperatures discussed above, pressures may be anticipated based on impending load on the racks 20a–20c and/or sections of the racks.

Although FIG. 2 illustrates three temperature sensors 212–216 and two pressure sensors 50a and 50b, it should be understood that the number of sensors is not critical to the operation of this embodiment of the invention. Instead, the cooling system 202 may include any reasonably suitable number of sensors to thus measure any reasonably suitable number of conditions within the data center 10 or portions thereof. The number of sensors and the measurements thereby may be upgradeable, e.g., scalable, to include any additional components, racks, and/or locations that may be included in the data center. In addition, the sensors need not be stationary. In this regard, according to another embodiment of the invention, a mobile device (not shown) is implemented to gather or measure at least one local environmental condition (e.g., temperature, pressure, air flow, humidity, etc.) in the data center 10. More particularly, the mobile device is configured to travel around the racks to determine the one or more environmental conditions at various locations throughout the data center. In addition, the device may be configured to detect the one or more environmental conditions at various heights throughout the data center.

A more detailed description of the above-described embodiment may be found in copending U.S. application Ser. No. 10/157,892, filed May 31, 2002, which is assigned to the assignee of the present invention and is incorporated by reference herein in its entirety.

If there is an actual detected change or an anticipated change in the temperature of the respective racks 20a–20c and/or portions thereof, the vent controller 204 generally operates to manipulate the corresponding vent 12a and 12b to compensate, i.e., changes the volume flow rate, velocity, and other similar characteristics of the cooling fluid, for the change in temperature. In this respect, each of the racks 20a–20c and/or portions thereof generally receives substantially only the amount of cooling fluid necessary to maintain the temperature of the portions of the racks within a predetermined temperature range. As will be seen from the discussion hereinbelow, by controlling the cooling fluid flow in this manner, an essentially constant output from the compressor 30 and/or the fan 22 may be manipulated to deliver a substantially optimized level of cooling to the racks 20a–20c, thereby increasing the efficiency of the cooling system and thus decreasing the operating costs required to operate these devices.

The vent controller 204 may manipulate the vents 12a and 12b based upon the sensed and/or anticipated pressure of the fluid at various locations in the plenum 18 to vary the flow of cooling fluid through the vents 12a and 12b, to thereby substantially maintain the pressure of the cooling fluid at these locations within a predetermined pressure variance. If there is an actual detected change or an anticipated change in the pressure differences between these locations, the vent controller 204 generally operates to manipulate one or more of the vents 12a and 12b to compensate, i.e., changes the flow resistance of the cooling fluid within the plenum 18, for the change in pressure difference. Thus, the vent controller 204 is operable to modulate the pressure within the plenum 18 substantially as indicated by the measured and/or anticipated heat loads in the racks 20a–20c. Consequently, the cooling system 202 may be more efficient than conventional cooling systems while utilizing relatively low cost, substantially constant speed devices (e.g., the compressor 30 and the fan 22). As will be seen from the discussion hereinbelow, by controlling the cooling fluid flow in this manner, sufficient pressure may be maintained throughout the plenum 18 to respond to detected or anticipated changes in the heat loads of the various components in the racks 20a–20c.

Vent interface electronics 218 may be provided to act as an interface between the vent controller 204 and the components, e.g., control the opening in the vents and the direction of cooling fluid flow through the vents, etc., for operating the vents 12a and 12b.

The vent controller 204 may also be interfaced with a vent memory 220 configured to provide storage of a computer software that provides the functionality of the cooling system and may be executed by the vent controller 204. The memory 220 may also be configured to provide a storage for containing data/information pertaining to the manner in which each of the vents 12a and 12b may be manipulated in response to the detected and/or anticipated temperatures of the portions of the racks 20a–20c. Furthermore, the memory 230 may be configured to store data/information pertaining to the control of the vents 12a and 12b corresponding to the measured pressures (and/or pressure differences) corresponding to various locations within the plenum 18. More particularly, a look up table (not shown) may be stored in the memory 220. By way of example, the look up table may include information pertaining to the direction of fluid flow, relative opening amount (e.g., 0 to 100%) for the vents 12a and 12b, pressures at the various locations, pressure differences, and the like. In this respect, the direction and amount open may be varied substantially incrementally in response to detected changes in the volume flow rate. The memory 220 may be implemented as a combination of volatile and non-volatile memory, such as dynamic random access memory (DRAM), EEPROM, flash memory, and the like.

Although FIG. 2 illustrates a single vent controller 204 configured to operate the vents 12a and 12b, it should be understood that a plurality of vent controllers may be implemented to perform the functions of the vent controller 204 without deviating from the scope and spirit of the invention.

In another embodiment, the plenum temperature sensor 52 may be configured to measure the temperature of the fluid within the second chamber 48b. The temperature measurements and/or any discernable changes in the temperature obtained by the plenum temperature sensor may also be relayed to the cooling system controller 222. In this regard, the cooling system controller 222 may, via interface electronics 228, manipulate the capacity of the compressor 30 based upon the measured temperature of the fluid. That is, the temperature of the fluid within the second chamber 48b may be maintained within a predetermined temperature range by manipulation of the compressor (e.g., cycled on and off, varied, and the like). In this manner, and in conjunction with the operation of the vents 12a and 12b as described hereinabove, the cooling system 252 may be operated relatively more efficiently than conventional cooling systems. Thus, the amount of energy necessary is substantially lower than that of conventional cooling systems.

Furthermore, although not illustrated in FIG. 2, it is within the scope of various embodiments of the invention that the vent controller 204 and cooling system controller 222 may intercommunicate. In this manner, the output of the cooling system may be modified in response to sensed and/or anticipated pressures within the plenum 18. Thus, the pressure within the plenum 18 may be maintained throughout a relatively greater range of cooling fluid volume flow demands. For example, if the pressure within the plenum rises above a predetermined level, data associated with the plenum pressure may be relayed to the cooling system controller 222 and the output of the fan 22 may be reduced (e.g., varied, cycled off and on, etc.). Similarly, if the pressure within the plenum falls below a predetermined level, data associated with the plenum pressure may be relayed to the cooling system controller 222 and the output of the fan 22 may be increased, for example. These manipulations of the cooling system may be performed in conjunction with control of the vents 12a and 12b as described hereinabove.

Figure 3:
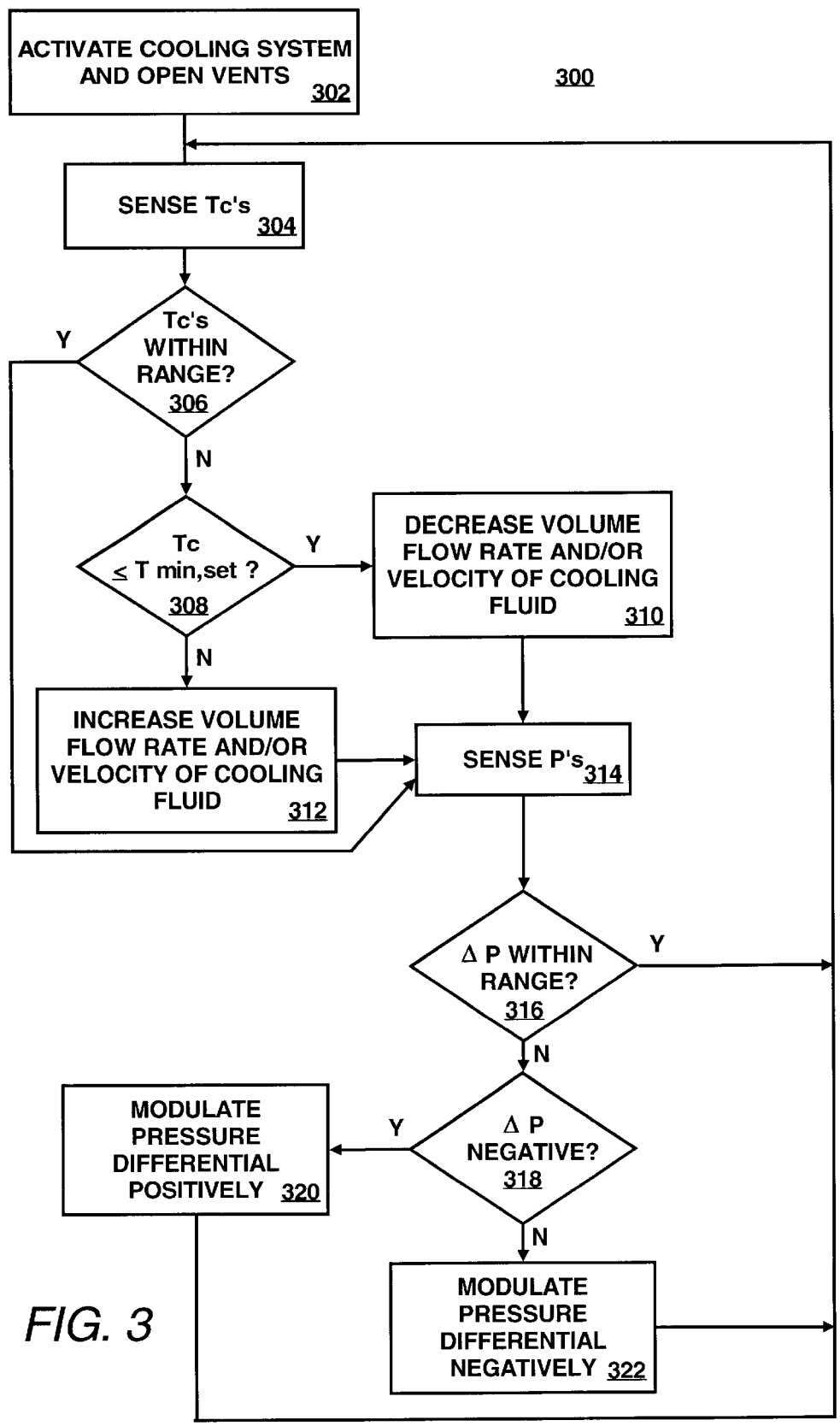
FIG. 3 shows a flow diagram of a manner in which an embodiment of the invention may be practiced.

FIG. 3 shows a flow diagram 300 of a manner in which an embodiment of the invention may be practiced. The following description of the flow diagram 300 is made with reference to the block diagram 200 illustrated in FIG. 2, and thus makes reference to the elements cited therein. It is to be understood that the steps illustrated in the flow diagram 300 may be contained as a utility, program, subprogram, in any desired computer accessible medium. In addition, the flow diagram 300 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Examples of computer readable storage devices include conventional computer system RAM (random access memory), ROM (read only memory), EPROM (erasable, programmable ROM), EEPROM (electrically erasable, programmable ROM), and magnetic or optical disks or tapes. Examples of computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the flow diagram 300, the cooling system 202 is activated at step 302. During this activation step, the various components of the cooling system 202 may be activated, initialized, etc. For example, control systems may be activated, the vents 12a and 12b may be opened, and the like. The temperature of a component (Tc) generally corresponds to the heat load of the heat dissipating components and therefore the subsystems contained in the racks 20a–20c. Therefore, the Tc's may be based upon the temperatures of specific heat dissipating components and subsystems. In addition, the Tc's may be based upon the temperatures in the general vicinity of the racks and/or sections of the racks. Thus, those skilled in the art will understand that certain embodiments of the invention may be employed with the temperature sensors 212–214 located at various positions throughout the data center. Moreover, use of the term "rack" herein generally refers additionally to sections of the racks and thus may not necessarily refer to an entire rack. Thus, the use of the term "rack" throughout the disclosure is not meant to limit certain aspects to entire racks, but instead, is implemented to simplify the description of certain embodiments of the invention.

At step 304, the temperatures of the components (Tc's) are sensed by the temperature sensors 212–216. Alternatively, the Tc's may be anticipated in the manner described hereinabove with respect to FIG. 2. Furthermore, it is within the scope of various embodiments of the invention that a plenum temperature is sensed by the plenum temperature sensor 52 and that the capacity of the cooling fluid within the plenum is regulated by the cooling system controller 222 in response to this sensed plenum temperature.

At step 306, it is determined whether the sensed temperatures of the components are within a predetermined range of operating temperatures, e.g., between a maximum set point temperature (Tmax,set) and a minimum set point temperature (Tmin,set). The predetermined range of operating temperatures may be set according to a plurality of factors. These factors may include, for example, the operating temperatures set forth by the manufacturers of the subsystems and components located in the racks, through testing to determine the optimal operating temperatures, etc. In addition, the predetermined range of operating temperatures may vary from one subsystem to another on the basis that various subsystems generally may operate effectively at various temperatures.

If the measured and/or anticipated temperatures are determined to fall within the predetermined range of operating temperatures, the cooling fluid pressure at various locations within the plenum 18 may be sensed at step 314. For those racks determined to have heat loads that do not fall within the predetermined temperature range, i.e., fall outside of Tmin,set and Tmax,set, it is determined whether the sensed temperature equals or falls below the Tmin,set at step 308. In general, the range of temperatures Tmin,set and Tmax,set pertains to threshold temperatures to determine whether to increase or decrease the flow of cooling fluid delivered to the racks. The predetermined temperature range may be based upon a plurality of factors, for example, a threshold operating range of temperatures that may be determined through testing to substantially optimize the performance of the subsystems contained in the racks. Moreover, the predetermined temperature range may vary for each rack because various components generally may operate effectively at various temperatures and thus various threshold temperatures may be optimal.

If the Tc's of some of the racks are below or equal to the Tmin,set, the vent controller 204 may operate to decrease the volume flow rate and/or the velocity of cooling fluid to those racks at step 310. The determination of whether to decrease either or both the volume flow rate and the velocity of the cooling fluid may be based upon the detected temperature of the racks. For example, if the subsystems on a bottom half of a rack are operating at 50 percent of maximum capacity, and the subsystems on an upper half of the rack are operating at or near zero capacity, the velocity of the cooling fluid may be reduced whereas the volume flow rate may remain substantially constant. This may occur, for example, because the cooling fluid need not travel a relatively long distance but may still need to supply the bottom half with a sufficient amount of cooling fluid.

If the Tc's of some of the racks exceed the Tmin,set (i.e., also exceed the Tmax,set), the vent controller 204 may operate to increase the volume flow rate and/or the velocity of cooling fluid to those racks at step 312. The determination of whether to increase either or both the volume flow rate and the velocity of the cooling fluid may be based upon the detected temperature of the racks. For example, if the subsystems on the top half of a rack are operating at 100 percent capacity, and the subsystems on a bottom half of the rack are operating at or near zero capacity, the velocity and the volume flow rate of the cooling fluid may both be increased. This may occur, for example, because the cooling fluid must travel a relatively long distance and supply the top half with a sufficient amount of cooling fluid.

According to an embodiment of the invention, the decrease in volume flow rate and/or velocity of the cooling fluid flow at step 310 and the increase in volume and/or velocity of the cooling fluid at step 312 may be accomplished by incrementally varying the cooling fluid flow through the vents. An example will be made for the instance where a vent allows a certain amount of cooling fluid to flow therethrough, and the vent is manipulated to decrease the volume flow rate of the cooling fluid, and where the decrease in fluid flow is insufficient to cause the Tc for that rack to fall within the predetermined range. In this instance, during a subsequent run through steps 304–310, the vent may be controlled to further decrease the volume flow rate of the cooling fluid therethrough by an incremental amount. By repeating this process a number of times, the temperature of the rack may be substantially brought within the predetermined range.

The pressure within the plenum 18 (P) generally corresponds to a combination of the flow volume of cooling fluid entering the plenum 18 and the flow resistance within the plenum 18. In a data center having a substantially constant output cooling system (e.g., the cooling system 14), the P therefore corresponds to the flow resistance within the plenum 18. According to various embodiments of the invention, the flow resistance within the plenum 18 may be altered by modulating the vents 12a and/or 12b. These modulations may be based upon the heat load of the heat dissipating components in the racks 20a–20c thus, the P may be associated with the temperatures of specific heat dissipating components and subsystems. In addition, the pressures at various locations within the plenum 18 (P's) may be heterogeneous due to localized factors, such as, proximity to vents, distance from the cooling system, and the like. Therefore, the pressures at various locations within the plenum 18 may fluctuate based upon the temperatures in the general vicinity of the racks and/or sections of the racks. Thus, those skilled in the art will understand that certain embodiments of the invention may be employed with the temperature sensors 212–214 located at various positions throughout the data center.

Following an increase and/or decrease in volume flow rate and/or velocity of the cooling fluid flow, the cooling fluid pressures ("P's") at various locations within the plenum 18 may be measured by the pressure sensors 50a and 50b at step 314. Alternatively, the P's may be anticipated in the manner described hereinabove with respect to FIG. 2. The information associated with the P's may be relayed to the vent controller 204. The vent controller 204 may determine a pressure differential ($\Delta P$) between the P's. In addition, the vent controller 204 may determine whether the $\Delta P$ is within a predetermined pressure differential, e.g., between a predetermined maximum negative pressure variance and a predetermined maximum positive pressure variance, at step 316. The predetermined pressure differential may be set according to a substantial optimum operating pressure differential desired for controlling the flow of cooling fluid through the vents, through testing to determine the optimal flow characteristics, etc. If the ΔP is within the predetermined pressure differential, the vent controller 204 returns to step 304.

If the ΔP does not fall within the predetermined pressure differential, i.e., fall outside of the predetermined maximum negative pressure variance or the predetermined maximum positive pressure variance, it is determined whether the ΔP is negative at step 318. The predetermined pressure differential may be based upon a plurality of factors, for example, a threshold operating pressure differential range that may be determined through testing to substantially optimize the flow of cooling fluid to the racks.

If the ΔP is negative, the vent controller 204 may operate to modulate the flow resistance within the plenum 18 (e.g., modulate the volume flow rate of cooling fluid through one or more vents) to positively influence the ΔP at step 320. The determination of which vent(s) to modulate the volume flow rate of the cooling fluid therethrough may be based upon the detected pressures within the plenum 18, temperatures of the racks, and the like.

By way of a general example, Tc's outside of the predetermined range of operating temperatures (e.g., above the Tmax,set or below the Tmin,set) may be relied upon to select particular vent modulation procedures (from a plurality of possible vent modulation procedures) based on pressure deviations. More specifically, if the pressure at pressure sensor 50a exceeds the pressure at pressure sensor 50b by an amount greater than the predetermined pressure differential, the pressure differential may be reduced in a variety of manners. This variety of manners (e.g., procedures) may include, but are not limited to: A) increase flow through the vent 12a; B) decrease flow through the vent 12b; and C) combination of increasing flow through the vent 12a while decreasing flow through the vent 12b. However, according to an embodiment, if the Tc's of racks 20a and 20b are below the Tmin,set, manner "B" may be selected to reduce the pressure differential while not further reducing the Tc's of racks 20a and 20b.

In order to reduce the possibility of inducing fluctuations of a cyclic nature, modulations to regulate the pressure may be performed in increments that differ in degree as compared to those utilized to regulate temperature (e.g., in steps 310 and 312). For example, if at step 310, the vent 12a is modulated to increase the flow volume by 10 cubic feet per minute ("cfm"), then at step 320, the vents 12a and 12b may one or both be modulated to alter the flow volume by 4 cfm. In this manner, the overall volume flow rate may remain relatively stable and the pressure differential within the plenum 18 may be substantially controlled.

Alternatively, if the ΔP is positive, and thus above the predetermined maximum positive pressure variance by virtue of the ΔP being outside the predetermined pressure differential at step 316, the vent controller 204 may operate to modulate the flow resistance within the plenum 18 (e.g., modulate the volume flow rate of cooling fluid through one or more vents) to negatively influence the ΔP at step 322. Furthermore, it is within the scope of various embodiments of this invention that the modulations performed in steps 310, 312, 320, and 322 may be combined and thus, performed once per cycle through steps 304–322.

Following steps 320, 322, or 316 (if the ΔP is within the predetermined pressure differential), the Tc's are sensed again at step 304. In addition, the steps following step 304 may be repeated for an indefinite period of time so long as the cooling system 202 is in operation.

It should be appreciated that the Tc's of some of the racks may fall below the Tmin,set, whereas the Tc's of other racks may exceed the Tmax,set. Thus, it should be appreciated that steps 310 and 312 may be respectively and substantially simultaneously performed on the various racks. Similarly, the ΔP's between some locations within the plenum 18 may fall below the predetermined maximum negative pressure variance while the ΔP's between other locations exceed the predetermined maximum positive pressure variance. Thus, it is to be understood that steps 320 and 322 may be respectively and substantially simultaneously performed on the various vents.

Figure 7:
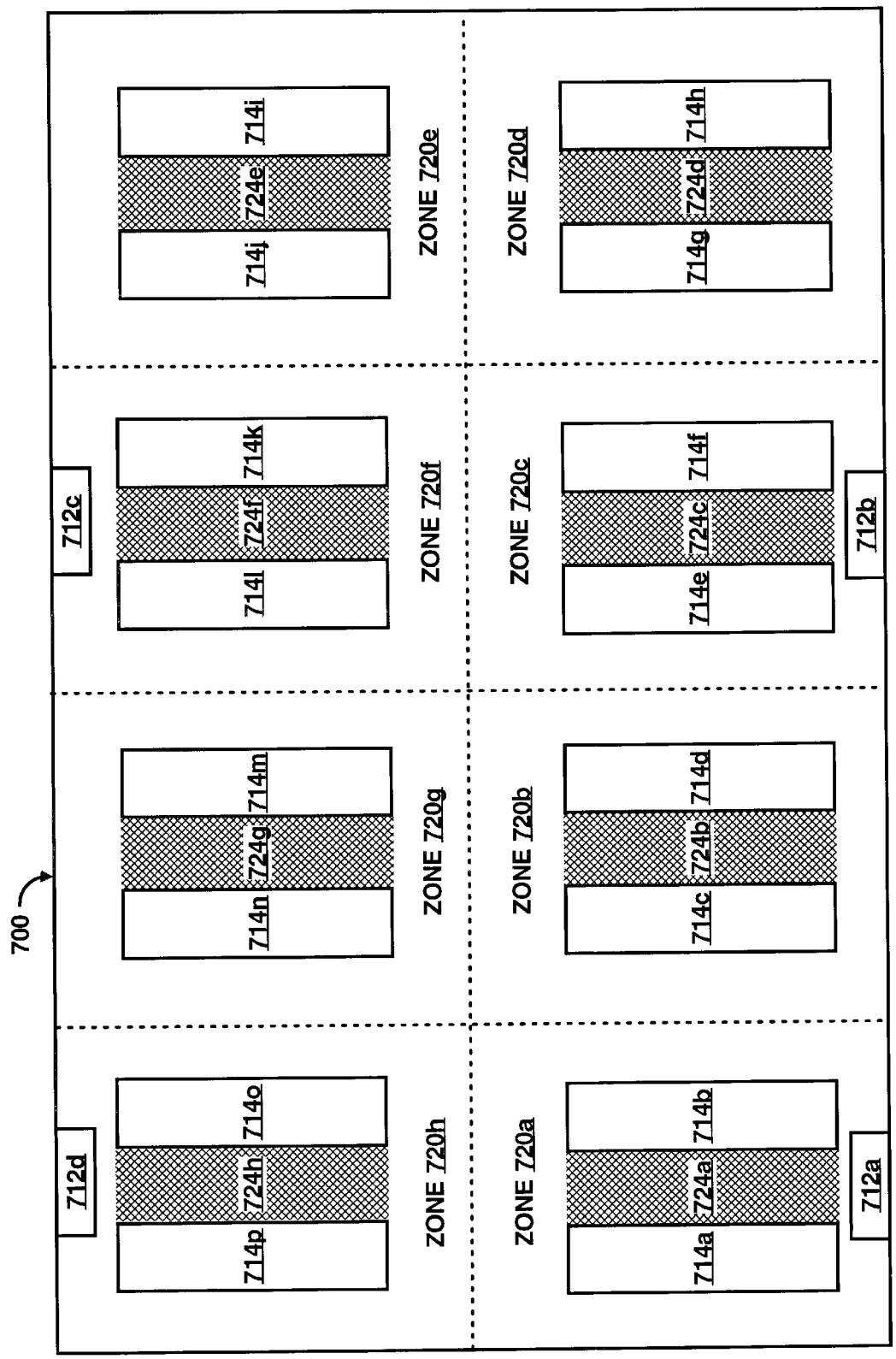
FIG. 7 shows a simplified schematic illustration of a data center including a plurality of zones and a plurality of cooling systems in accordance with another embodiment of the invention.

In the above example, a relatively simplified data center having one cooling system is described. However, it is to be understood that embodiments of the invention may be practiced in any suitable environment. For example, in a data center having a plurality of zones, differences in cooling fluid pressure between the plurality of zones may be controlled. An example of such a data center is illustrated in FIG. 7, which will be described in greater detail hereinbelow.

Figure 4A:
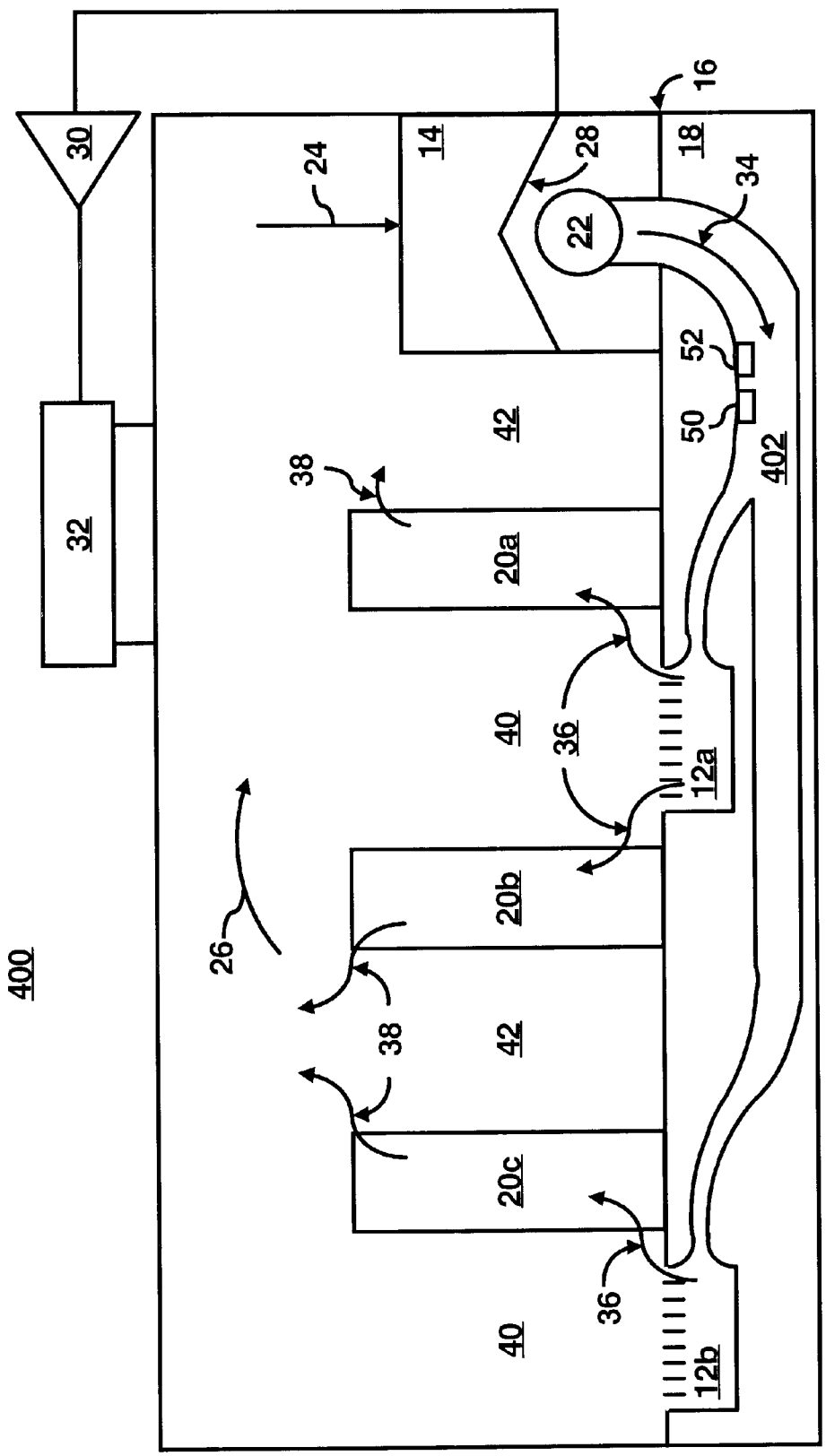
FIGS. 4A and 4B each show a simplified schematic illustration of the data center illustrated in FIG. 1 containing a cooling system in accordance with an alternate embodiment of the invention.

In FIG. 4A, there is illustrated a simplified schematic illustration of a data center 400 containing according to another embodiment of the invention. The elements illustrated in the data center 400 operate in substantially the same manner as those elements illustrated in the data center 10. However, one difference lies in the manner in which cooling fluid is supplied to the vents 12a and 12b. That is, a duct 402 (e.g., a plenum, pressurized enclosure, and the like) may provide an essentially direct connection from the cooling system 14 to the vents 12a and 12b. Because of the apparent similarities between the data centers 10 and 400, only those elements that differ between the FIGS. 1 and 4A will be described hereinbelow.

The duct 402 may be constructed from any suitable, essentially impermeable, material, e.g., metal, plastic, resin, etc. According to this embodiment of the invention, the duct 402 may placed under a new or existing raised floor 16 and thus, the raised floor 16 need not be configured to maintain the pressure of cooling fluid therein. Furthermore, it is within the scope of the invention that the duct 402 and vents 12a and 12b may be located in a raised ceiling (not shown), may be attached to a ceiling, may be placed near or on a wall, and/or may be located in any suitable location within the data center 400.

Figure 4B:
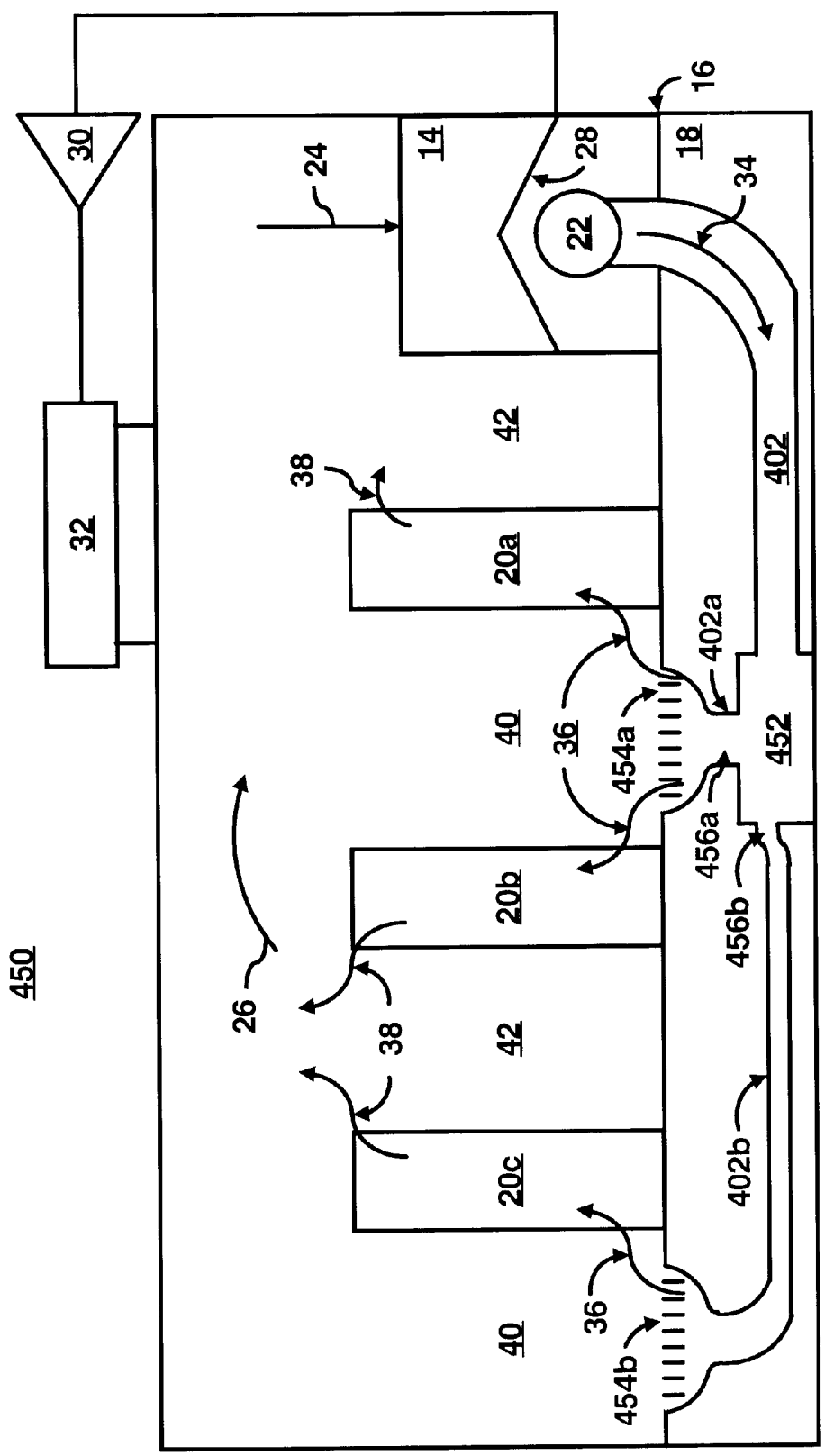

FIG. 4B illustrates a data center 450 according to yet another embodiment of the invention. As shown in FIG. 4B, the data center 450 includes the cooling system 14 configured to supply cooling fluid, e.g., air through the duct 402 (e.g., a plenum) in a manner similar to the embodiment of the invention illustrated in FIG. 4A. This embodiment also operates in a similar manner to the embodiments illustrated in FIGS. 1, 2, and 3. One difference between the embodiment illustrated in FIG. 4B and those embodiments is that the flow resistance of cooling fluid within the plenum is modulated by a dynamically controllable variable volume device ("VVD") 452. It should be understood that the VVD 452 operates in much the same manner as a damper assembly (shown in FIGS. 5 and 6) for the vents 12a–12b described hereinabove with respect to FIGS. 1–3. Other potential differences from the other embodiments may include: 1) the VVD 452 may be connected, via one or more ducts 402, to a plurality of vent assemblies 454a and 454b (see FIGS. 5 and 6); and 2) the VVD 452 may be configured to substantially independently control the flow of cooling fluid to each vent assembly 454a and 454b.

With regard to the potential differences outlined above, the VVD 452 may be configured with a plurality of outlets 456a and 456b configured for attachment to the ducts 402a and 402b. Each of the ducts 402a and 402b include a first end configured for attachment to an outlet 458a or 458b and a second end configured for attachment to the vent assembly 454a or 454b. Furthermore, the VVD 452 may be configured with a flow control device, such as a damper (see FIG. 6), positioned at some or all of the outlets 458a and 458b (not explicitly shown in FIG. 4B). In this manner, the flow of cooling fluid through each of the vent assemblies 454a and 454b may be controlled by the VVD 452.

FIG. 5 shows a simplified schematic illustration of a dynamically controllable floor tile vent ("vent") 500 in accordance with an embodiment of the invention. In this regard, the vent 500 is an example of the vents 12a and 12b discussed hereinabove. The vent 500 includes a vent assembly 454, a damper assembly 504, and an inlet 506. In operation, cooling fluid (e.g., air, etc.) enters the vent 500 through the inlet 506, as indicated by arrow 508, continues through the damper assembly 504, and is exhausted out through the vent assembly. According to this embodiment of the invention, the flow of cooling fluid through the vent 500 is automatically regulated by a variable damping device (See FIG. 6).

The vent assembly 454 may be constructed from any suitable structural materials, such as: metal, plastics, resin, composite, or the like. Furthermore, it is within the scope of various embodiments of the invention that the vent assembly 454 may be an existing vent assembly.

The damper assembly 504 may be constructed from any suitable structural materials, such as: metal, plastics, resin, composite, or the like. In an embodiment of the invention, the damper assembly 504 may be configured for attachment to an existing vent assembly 454. In another embodiment of the invention, the vent assembly 454 and the damper assembly 504 may be constructed as essentially one piece. Furthermore, in yet another embodiment, the damper assembly 504 may be configured to include a plurality of dampers 602 an example of which is illustrated in FIG. 4B. As shown in FIG. 4B, the VVD 452 essentially functions as the damper assembly 504 for a plurality of vent assemblies 454. Therefore, it is within the scope of various embodiments of the invention that the damper assembly 504 may be operable to control characteristics of cooling fluid flow to a plurality of vents and/or within a plenum in fluid communication with the damper assembly 504.

FIG. 6 is a simplified cross sectional illustration of the vent 500 in accordance with an embodiment of the invention. As shown in FIG. 6, the vent assembly 454 includes a vent grille 600. While in one form the vent grille 600 may be an essentially static series of louvers, it is within the scope of an embodiment of the invention that the vent grille be a dynamically adjustable device configured to control the direction of cooling fluid flow therethrough.

In addition, a dynamically controllable damper ("damper") 602 may be positioned with respect to the damper assembly 504 in such a manner as to control the flow of cooling fluid flowing through the damper assembly 504. In this regard, a damper disc 604 may be modulated by an actuator 606 to allow variable amounts of cooling fluid to flow through the inlet 506. For example, a screw 608 may be rotated by the actuator 606 and thereby adjust the position of the damper disc within the inlet 506. A stop 610 may be secured to the screw 608 to limit one aspect of travel 612 available to the damper disc 604. The configuration of the actuator 606 may limit another aspect of the travel 612. In operation, the actions of the damper 602 may be controlled by a vent controller such as, vent controller 204 (See FIG. 2). This vent controller may be in or near the vent 500 (e.g., local) and/or the vent controller may be centralized with respect to the data center. In an embodiment of the invention, the actions of the damper 602 may be based on the amount of heat dissipated and/or the anticipated amount of heat dissipated by racks supplied cooling fluid by the vent 500. In various other embodiments, the actions of the damper 602 may be based on sensed cooling fluid pressures and/or velocities.

As the actions of the damper disc 604 along the screw 608 are controlled within the limits of travel 612, the position of the damper disc 604 may be said to vary from "open" to "closed" and any position in between. In the open position, a relative maximum amount of cooling fluid may flow therethrough, while in the closed position, a relative minimum amount of cooling fluid may flow therethrough.

Moreover, it is within the scope of the invention that a fan (not shown) may be utilized in conjunction or as a replacement for the damper 602. For example, to increase the flow of cooling fluid through the vent grille 600, the fan may be controlled to increase the speed of rotation in a relatively forward direction. In another example, to decrease the flow of cooling fluid through the vent grille 600, the fan may be controlled to decrease the speed of rotation in a relatively forward direction, substantially stop the rotation, or rotate the fan in a relatively reverse rotational direction. In this manner, the actions of the fan may be utilized to control airflow through the vent 500 and/or the pressure within the plenum 18. With regard to the use of a fan within the damper assembly 504, it should be noted that a method of use for such a fan may include a step of activating the fan. This step of fan activation may be included in a more general step of cooling system activation. Thus, with reference to FIG. 3, at step 302, instead of or in addition to opening the vents, the fan may be activated.

FIG. 7 shows a simplified schematic illustration of a data center 700 including a plurality of zones 720a–720h and a plurality of cooling systems 712a–712d in accordance with another embodiment of the invention. The data center 700 of this embodiment is similar to the data center 10 described hereinabove and thus only those features which are reasonably necessary for a complete understanding of this embodiment are described hereinbelow.

The data center 700 may further include a plurality of dynamically controllable vents 724a–724h configured to supply cooling fluid to a plurality of racks 714a–714p in a manner similar to the vents 12a and 12b described hereinabove. Moreover, although not explicitly shown in FIG. 7, the plurality of zones may include a plurality of pressure sensors configured to relay their respective measurements to the vent controller 204. For example, a respective pressure sensor may be located below each of the plurality of vents 724a–724h. Thus, cooling fluid pressure differences between the plurality of zones 20a–20h may be controlled in a manner similar to the method 300.

In various embodiments of the invention, the cooling systems 712a–712d may be constant or variable output devices. In an example of essentially constant output cooling systems 712a–712d, an embodiment may be practiced which increases the range of heat loads a subset of the plurality of cooling systems may be able to effectively cool. In this manner and by automatically turning individual cooling systems on or off, one or more of the cooling systems may remain off for periods of time. Thus increasing efficiency and saving resources. In addition, in a data center

700 having one or more variable output cooling systems, for example, an embodiment may be practiced which increases efficiency by maintaining essentially the same cooling fluid pressure throughout the data center 700. In particular, pressure at relatively downstream (from a cooling system) locations within the plenum may be maintained at essentially the same pressure as relatively upstream locations. In this manner, vents in fluid communication with these relatively downstream locations may receive sufficient cooling fluid pressure to generate desired flow volume and/or velocity.

In accordance with an embodiment of the invention, the cooling requirements within a data center may be analyzed to substantially optimize the layout of the racks within the data center. In one respect, the substantial optimization of the rack layout in the data center may enable the cooling system of the data center to operate at generally lower energy and greater efficiency levels by virtue of the reduced workload placed on the components of the cooling systems, e.g., compressors, fans, etc. The cooling requirements within the data center may be analyzed by operation of any reasonably suitable commercially available computational fluid dynamics (CFD) tool, e.g., FLOVENT, a 3-D modeling software capable of predicting temperature variations based upon fluid flows. By virtue of the numerical modeling, various air conditioning units as well as the vents described hereinabove may be positioned throughout the data center to substantially control the manner in which the racks receive the cooling fluid. In addition, the air conditioning units may also be positioned to substantially maximize and optimize their performances, e.g., to prevent one or more of the air conditioning units from being overworked.

In determining the cooling fluid distribution requirement within the data center, each of the racks may be assigned a heat load which may correspond to a maximum heat load predicted for that rack, e.g., through anticipated power draw. For example, a rack containing 40 subsystems, e.g., computers, may have a maximum heat load of 10 KW and a rack containing 20 subsystems may have a maximum heat load of 5 KW. By implementing the CFD in this manner, for example in a data center containing 100 racks and four air conditioning units, racks having a potential for relatively larger heat loads may be relatively separately located throughout the data center. In one respect, therefore, the air conditioning units within the data center may be operated at substantially less than maximum power levels and the racks may receive sufficient amounts of cooling fluid. More specifically, the power required to operate the air conditioning units may be regulated to efficiently cool the fluid supplied to the racks by providing substantially only that amount of cooling fluid necessary to maintain the racks within normal operating temperatures.

According to another embodiment of the invention, a CFD tool may be implemented substantially continuously with the embodiments described hereinabove with respect to FIGS. 1–7. More specifically, the CFD tool may be utilized to substantially continuously vary the operation of the cooling system to operate according to the heat loads generated in the racks. In this regard, the anticipated or actual heat loads (e.g., based upon the power draw of the components) on the racks may be inputted into the CFD tool, along with one or more of the following properties: velocity of the cooling fluid flowing through various sections of the data center and the distribution of temperature and pressure of the cooling fluid in the data center, to determine an optimal manner in which the air conditioning units may be operated as well as the flow of the cooling fluid through the vents to adequately cool the racks based upon an analysis of the data center layout and the heat loads. The CFD tool may be implemented to produce a numerical model of the data center to thus determine an optimized cooling distribution within the data center. A correlation of one or more of the following properties: velocity of the cooling fluid flowing through various sections of the data center, distribution of temperature and pressure of the cooling fluid in the data center, and the power draw into the racks, may be created based on the numerical modeling. The correlation may be used to infer thermal conditions throughout the data center when only a minimum number of sensors are available during operation of the cooling system. In addition, the correlation may substantially reduce the amount of time required for the CFD tool to perform the computing operations.

Thus, for example, with respect to FIG. 3, at step 312, a numerical model may be created to analyze an optimal manner in which the flow resistance, volume flow and/or the velocity of the cooling fluid may be increased while considering the effects of fluid flow from other racks. In this respect, based upon the analysis, the vent supplying that rack with cooling fluid and/or another vent may be caused to vary the flow resistance, volume flow and/or velocity of the cooling fluid. In addition, at step 314, the numerical model may be created to determine whether the cooling system output should be decreased based upon the heat loads and the fluid flow throughout the data center. For example, if it is determined that a rack with an increasing heat load may receive a sufficient amount of cooling fluid by receiving cooling fluid from a vent generally away therefrom, the cooling system output may not be increased. Thus, by implementation of the CFD tool to generally analyze the fluid pressure, flow characteristics and/or the temperatures of the racks, the amount of energy required to sufficiently cool the racks in the data center may be substantially optimized.

By virtue of certain aspects of the invention, one of ordinary skill in the art will readily recognize that the amount of energy, and thus the costs associated with cooling the racks located within a data center may be substantially reduced. In one respect, by operating the cooling system to supply cooling fluid substantially only as needed by the racks, the cooling system may be operated at a relatively more efficient manner as compared to conventional cooling systems.

What has been described and illustrated herein is an embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method of controlling cooling fluid pressure within a plenum of a cooling system for cooling a plurality of racks in a data center, said method comprising:

activating said cooling system, said cooling system including a cooling device in fluid communication with said plenum, said plenum being in fluid communication with a vent configured to supply cooling fluid to said racks;

sensing a plurality of cooling fluid pressures at a plurality of respective locations within said plenum;

determining whether pressure differences between said plurality of sensed cooling fluid pressures are within a predetermined pressure differential; and modulating a variable volume device positioned between said plenum and said vent in response to said pressure differences being outside said predetermined pressure differential, wherein said variable volume device is configured to control a flow resistance of cooling fluid within said plenum.

2. The method according to claim 1, further comprising:
individually controlling cooling fluid flow to a plurality of vents configured to supply cooling fluid to said racks by controlling said flow resistance of cooling fluid within said plenum.

3. The method according to claim 1, further comprising:
determining whether said pressure differences are below or equal to a predetermined maximum negative pressure variance.

4. The method according to claim 3, further comprising:
modulating said flow resistance of said variable volume device to positively influence said pressure differences in response to said pressure differences falling below or equaling said predetermined maximum negative pressure variance.

5. The method according to claim 3, further comprising:
modulating said flow resistance of said variable volume device to negatively influence said pressure differences in response to said pressure differences being above said predetermined maximum negative pressure variance.

6. The method according to claim 1, further comprising:
sensing temperatures of said racks;
determining whether said sensed temperatures are within a predetermined temperature range; and
varying said supply of cooling fluid to said racks in response to said sensed temperatures falling outside of said predetermined temperature range.

7. The method according to claim 6, further comprising:
decreasing said supply of cooling fluid to at least one rack having a relatively lower temperature.

8. The method according to claim 6, further comprising:
increasing said supply of cooling fluid to at least one rack having a relatively higher temperature.

9. The method according to claim 6, further comprising:
decreasing said supply of cooling fluid to at least one rack having a relatively lower temperature relative to said supply of cooling fluid to at least one rack having a relatively higher temperature.

10. The method according to claim 1, further comprising:
performing a numerical modeling of a pressure distribution and flow characteristics of the data center; and
modulating said variable volume device in response to said numerical modeling.

11. The method according to claim 10, further comprising:
implementing said numerical modeling to correlate at least two of temperature, velocity and pressure of said cooling fluid and power draw of said racks within said data center to thereby infer a thermal condition throughout said data center, wherein said modulating step further comprises modulating said variable volume device in response to said inferred thermal condition.

12. A cooling system for cooling racks in a data center, said system comprising:
a cooling device for supplying cooling fluid to said racks, said cooling device including a fan;
a plenum having an inlet and an outlet, wherein said inlet of said plenum is in fluid communication with said fan;
a vent assembly for delivering said cooling fluid to said racks, said vent assembly being in fluid communication with said outlet of said plenum; and
a variable volume device in fluid communication with said plenum and said vent assembly, said variable volume device being positioned between said plenum and said vent assembly, wherein said variable volume device is operable to control pressure differences of said cooling fluid between a plurality of locations within said plenum by modulating flow resistance of said cooling fluid within said plenum.

13. The system according to claim 12, further comprising:
a plurality of dampers controllable to vary said flow resistance at said plurality of locations within said plenum, wherein said variable air volume device includes at least one damper of said plurality of dampers; and
a vent controller operable to control said plurality of dampers, wherein said vent controller is configured to control said pressure of said cooling fluid within said plenum.

14. The system according to claim 13, further comprising:
a plurality of pressure sensors configured to sense said pressure of said cooling fluid at said plurality of locations within said plenum, wherein said vent controller is operable to modulate said plurality of dampers in response to said sensed pressure.

15. The system according to claim 14, further comprising:
a plurality of temperature sensors configured to measure temperatures of said racks, wherein said vent controller is configured to control said plurality of dampers in response to said measured temperatures of each of said racks.

16. The system according to claim 14, wherein said vent controller is operable to independently control said plurality of dampers on the basis of an anticipated amount of heat generation by said racks.

17. The system according to claim 12, wherein said plenum includes a divider, said divider being operable to divide said plenum into a first chamber and a second chamber.

18. The system according to claim 17, wherein said first chamber is in fluid communication with said cooling device and said second chamber is in fluid communication with said variable volume device, and wherein said divider operates to maintain the pressure of said cooling fluid in said second chamber at a substantially uniform pressure.

19. A system for controlling cooling fluid pressure within a plenum of a cooling system for cooling a plurality of racks in a data center, said system comprising:
means for activating said cooling system, said cooling system including a cooling device in fluid communication with said plenum, said plenum being in fluid communication with a vent configured to supply cooling fluid to said racks;
means for sensing a plurality of cooling fluid pressures at a plurality of respective locations within said plenum;
means for determining whether pressure differences between said plurality of sensed cooling fluid pressures are within a predetermined pressure differential; and
means for modulating a variable volume device positioned between said plenum and said vent in response to said-pressure differences being outside said predetermined pressure differential, wherein said variable volume device is configured to control a flow resistance of cooling fluid within said plenum.

20. The system according to claim 19, further comprising:
means for individually controlling cooling fluid flow to a plurality of vents configured to supply cooling fluid to said racks.

21. The system according to claim 19, further comprising:
means for determining whether said pressure differences are below or equal to a predetermined maximum negative pressure variance.

22. The system according to claim 21, further comprising:
means for modulating said flow resistance of said variable volume device to positively influence said pressure differences in response to said pressure differences falling below or equaling said predetermined maximum negative pressure variance.

23. The system according to claim 21, further comprising:
means for modulating said flow resistance of said variable volume device to negatively influence said pressure differences in response to said pressure differences being above said predetermined maximum negative pressure variance.

24. The system according to claim 19, further comprising:
means for sensing temperatures of said racks;
means for determining whether said sensed temperatures are within a predetermined temperature range; and
means for varying said supply of cooling fluid to said racks in response to said sensed temperatures falling outside of said predetermined temperature range.

25. The system according to claim 24, further comprising:
means for decreasing said supply of cooling fluid to at least one rack having a relatively lower temperature.

26. The system according to claim 24, further comprising:
means for increasing said supply of cooling fluid to at least one rack having a relatively higher temperature.

27. The system according to claim 24, further comprising:
means for decreasing said supply of cooling fluid to at least one rack having a relatively lower temperature relative to said supply of cooling fluid to at least one rack having a relatively higher temperature.

28. The system according to claim 19, further comprising:
means for performing a numerical modeling of a pressure distribution and flow characteristics of the data center; and
means for modulating said variable volume device in response to said numerical modeling.

29. The system according to claim 28, further comprising:
means for implementing said numerical modeling to correlate at least two of temperature, velocity and pressure of said cooling fluid and power draw of said racks within said data center to thereby infer a thermal condition throughout said data center, wherein said modulating step further comprises modulating said variable volume device in response to said inferred thermal condition.

30. A method of cooling a plurality of racks in a data center, said method comprising:
activating a cooling system, said cooling system including a cooling device in fluid communication with a plenum, said plenum being in fluid communication with a vent configured to supply cooling fluid to said racks;
sensing temperatures of said racks;
sensing pressure of said cooling fluid at a plurality of locations within said plenum;
determining whether said sensed temperatures of said racks are within a predetermined temperature range;
determining whether differences of said sensed pressure of said cooling fluid at said plurality of locations is within a predetermined pressure differential; and
modulating a variable volume device positioned between said plenum and said vent to varying said supply of cooling fluid to said racks in response to said sensed temperatures and said sensed pressure, wherein said variable volume device is configured to control a flow resistance of cooling fluid within said plenum.

31. The method according to claim 30, further comprising:
sensing a plenum temperature;
determining whether said sensed plenum temperature is within a predetermined plenum temperature range; and
varying a capacity of said cooling fluid in response to said sensed plenum temperature falling outside of said predetermined plenum temperature range.

32. The method according to claim 30, further comprising:
individually controlling cooling fluid flow to a plurality of vents configured to supply cooling fluid to said racks by controlling said flow resistance of cooling fluid within said plenum.

33. The method according to claim 30, further comprising:
determining whether said pressure differences are below or equal to a predetermined maximum negative pressure variance.

34. The method according to claim 33, further comprising:
modulating said flow resistance of said variable volume device to positively influence said pressure differences in response to said pressure differences falling below or equaling said predetermined maximum negative pressure variance.

35. The method according to claim 33, further comprising:
modulating said flow resistance of said variable volume device to negatively influence said pressure differences in response to said pressure differences being above said predetermined maximum negative pressure variance.

36. The method according to claim 30, further comprising:
performing a numerical modeling of a pressure distribution and flow characteristics of the data center; and
modulating said variable volume device in response to said numerical modeling.

37. The method according to claim 36, further comprising: implementing said numerical modeling to correlate at least two of temperature, velocity and pressure of said cooling fluid and power draw of said racks within said data center to thereby infer a thermal condition throughout said data center, wherein said modulating step further comprises modulating said variable volume device in response to said inferred thermal condition.

* * * * *